United States Patent [19]

Herold

[11] Patent Number: 5,153,854
[45] Date of Patent: Oct. 6, 1992

[54] EEPROM MEMORY SYSTEM HAVING SELECTABLE PROGRAMMING VOLTAGE FOR LOW POWER READABILITY

[75] Inventor: Barry W. Herold, Boca Raton, Fla.

[73] Assignee: Motorola, Inc., Schaumburg, Ill.

[21] Appl. No.: 707,975

[22] Filed: May 23, 1991

Related U.S. Application Data

[63] Continuation of Ser. No. 395,834, Aug. 18, 1989, abandoned.

[51] Int. Cl.[5] .................. G11C 7/00; G11C 16/02; G11C 16/06
[52] U.S. Cl. .................. 365/185; 365/104; 365/230.06; 365/189.01
[58] Field of Search .............. 365/185, 104, 189.01, 365/189.09, 189.03, 230.06

[56] References Cited

U.S. PATENT DOCUMENTS

| 4,775,958 | 10/1988 | Hashimoto | 365/185 |
| 4,829,203 | 5/1989 | Ashmore, Jr. | 365/185 X |
| 4,855,955 | 8/1989 | Cioaca | 365/185 X |
| 4,858,187 | 8/1989 | Schreck | 365/185 |
| 4,896,298 | 1/1990 | Kowalski | 365/189.01 |

Primary Examiner—Alyssa H. Bowler

[57] ABSTRACT

A memory system for the non-volatile storage of digital information. The digital storage element is a semiconductor memory cell which is electrically erasable, readable, and programmable. There is a low voltage read mode provided to decrease system power requirements.

10 Claims, 3 Drawing Sheets

EEPROM MEMORY SYSTEM HAVING SELECTABLE PROGRAMMING VOLTAGE FOR LOW POWER READABILITY

This is a continuation of application Ser. No. 07/395,834, filed Aug. 18, 1989 now abandoned.

FIELD OF THE INVENTION

This invention relates in general to semiconductor memories and more particularly to electrically erasable programmable semiconductor memories.

BACKGROUND OF THE INVENTION

Electrically erasable programmable semiconductor memories are well known. The electrically erasable programmable read only memory (EEPROM) was developed to provide an easily alterable, non-volatile storage method for digital data. In order to program a MOS (metal oxide semiconductor) EEPROM device, a programming voltage must be applied to a selected EEPROM storage cell after the EEPROM is write enabled. The EEPROM programming voltage can be supplied externally or generated internally from a lower external voltage supply by a voltage multiplier. Digital data to be stored by the EEPROM typically is written to the storage cell using a $V_{pp}$ voltage supply of 25 volts DC, $V_{dd}$ voltage supply of 5 volts DC, and $V_{ss}$ voltage supply of 0 volts DC. The $V_{dd}$ and $V_{ss}$ voltage supplies are used to represent logical data values of true and false or "1" and "0", respectively, when providing data to the EEPROM in either a serial bit stream or parallel word format. Storage of digital data into EEPROM memory cells is determined by the addressing and bit organization hardware in the EEPROM. Current MOS technology used in EEPROM devices dictates that a programming voltage of 25 volts DC must be applied to the memory element, a floating gate field effect transistor, in the proper manner to either trap (write) or remove (erase) electrical charge from the floating gate. During programming, the programming voltage is applied via the row and column decoder circuitry to the memory cell. Because existing row and column decoder circuitry must provide an interface for the VDD and VSS voltages as well as the programming voltage, complex level shifting and breakdown protection topologies must be employed to prevent the cell from being re-programmed or erased during normal memory read access. This requirement increases complexity, reduces reliability, and increases the cost of the EEPROM. Another constraint imposed by the need for level shifting circuitry and the higher VDD voltage bias required this circuitry to function properly is that existing EEPROM's cannot be read below a VDD supply voltage of approximately 3.0 volts.

Thus, what is needed is a low power EEPROM circuit architecture capable of being read at a lower voltage.

SUMMARY OF THE INVENTION

Accordingly, it is an object of the present invention to provide an improved EEPROM cell.

In carrying out the above and other objects of the invention in one form, there is provided a circuit architecture for a memory system comprising a row decoder for selectively supplying first, second, third and programming voltages, a column decoder for selectively providing the third and programming voltages, a plurality of memory cells each uniquely coupled between the row decoder and the column decoder, data being written into a cell when the programming voltage and the third voltage is applied from the row decoder and the third voltage is applied from the column decoder, data being read from the cell when the first voltage is applied by the row decoder and the third voltage is applied by the column decoder, data being read from the cell when the second voltage is applied by the row decoder and the third voltage is applied by the column decoder, and data being erased from the cell when the programming voltage and the third voltage is applied by the row decoder and column decoder.

DETAILED DESCRIPTION OF THE INVENTION

Figure 1:
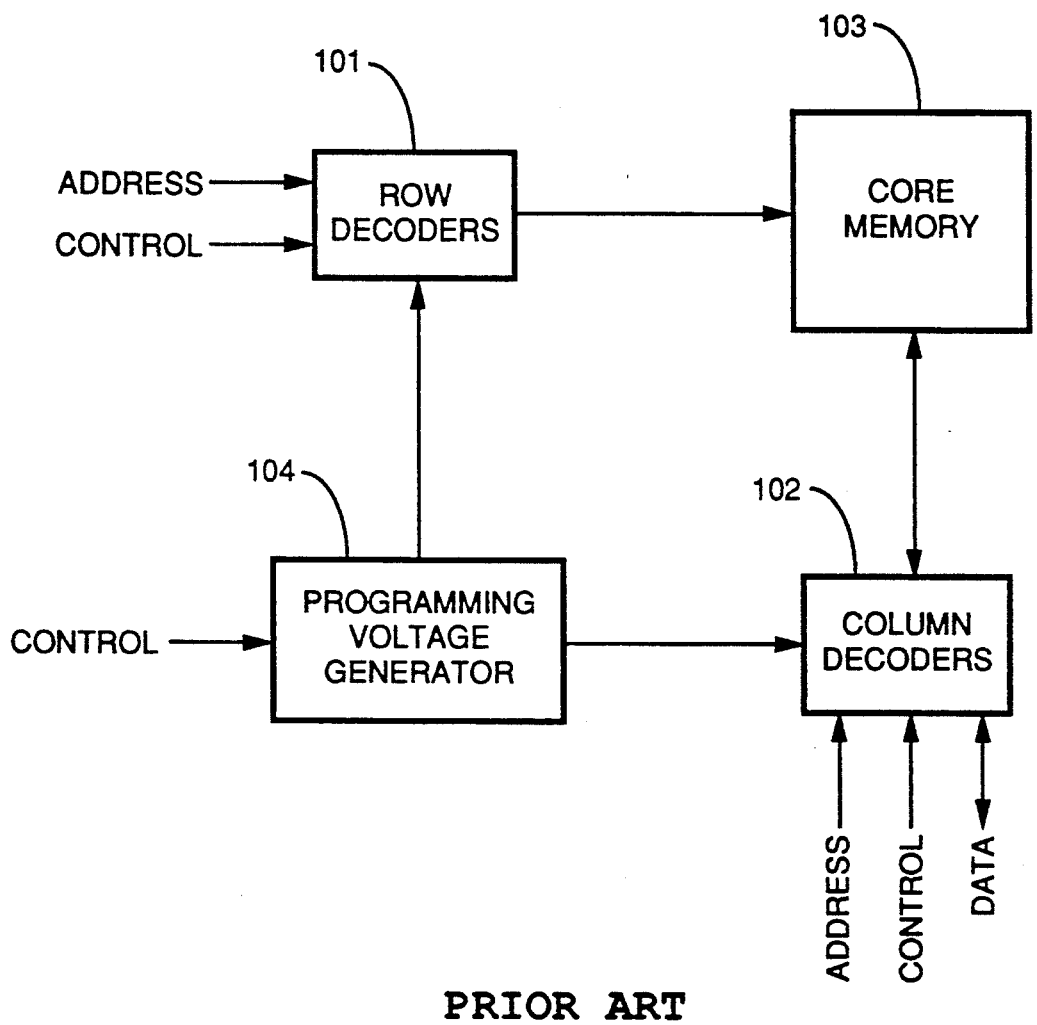
FIG. 1 is a block diagram of a prior art EEPROM memory system.

Referring to FIG. 1, the prior art EEPROM architecture shown comprises row decoders 101 and column decoders 102 having three input voltages, $V_{pp}$ (programming voltage, typically 25 volts DC), $V_{dd}$ (drain voltage, typically 5 volts DC), and $V_{ss}$ (source voltage, typically 0 volts DC). The $V_{dd}$ and $V_{ss}$ voltages are used to couple data, address, and control signals to and from peripheral devices (i.e. microprocessors, direct memory access controllers) and the core memory 103. The $V_{pp}$ supply is only required internal to the EEPROM device for programming the memory cell. All presently known EEPROM memory systems must leave the programming voltage generator 104 running or generate an intermediate voltage to provide bias for the row and column decoders 101, 102, because the row and column decoders 101, 102, have integrated the high voltage programming circuitry with the low voltage interface circuitry. By integrating the high and low voltage sections of the decoders, level shifting and breakdown protection circuitry must be included to prevent the high voltage from destroying devices in the low voltage sections. The fact that the programming voltage generator 104 is left on during all modes of operation wastes power.

Figure 2:
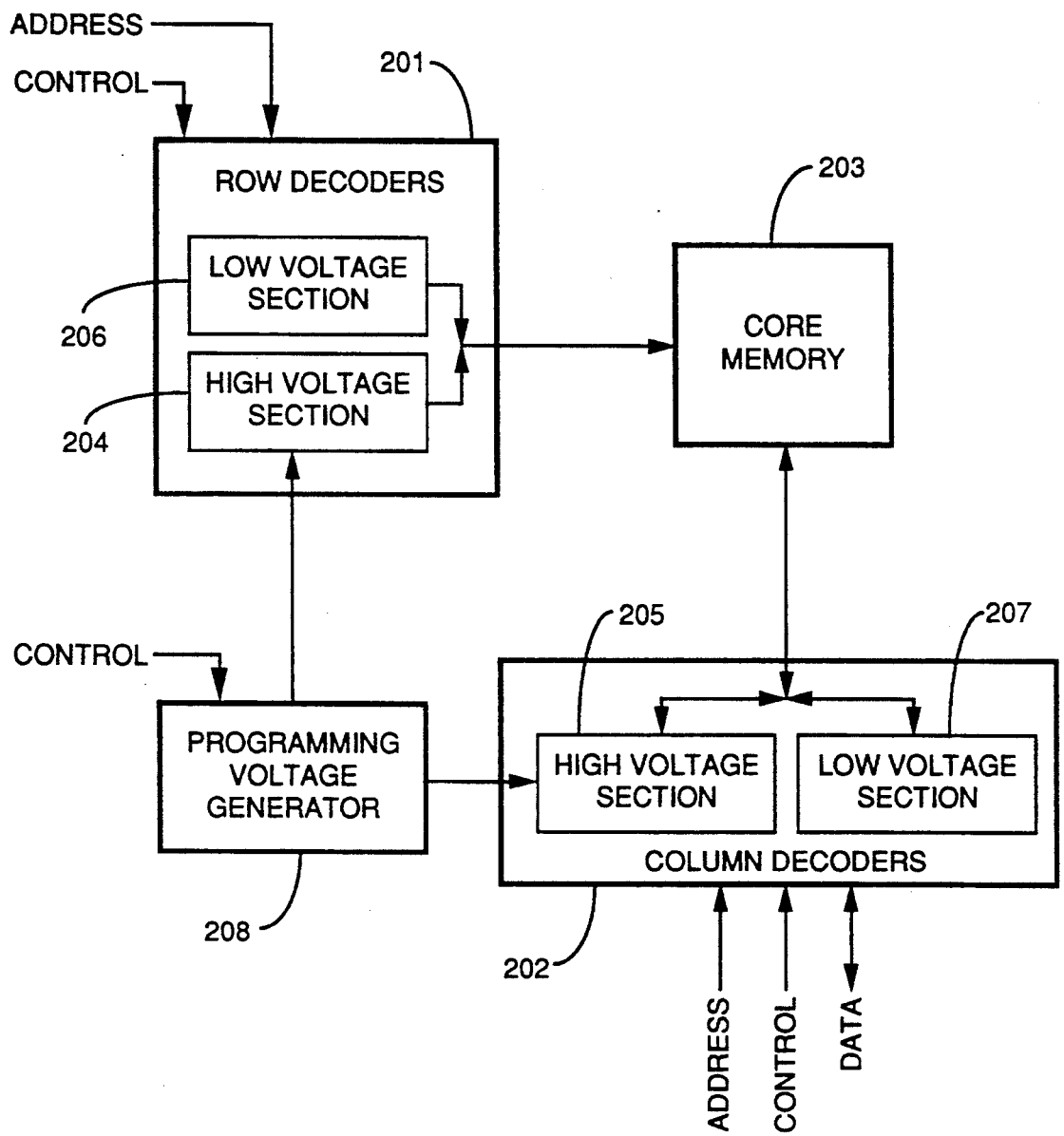
FIG. 2 is a block diagram of the EEPROM memory system in accordance with the preferred embodiment.

Referring to FIG. 2, the preferred embodiment of the memory system has row decoders 201 for selectively supplying first, second, third, and programming voltages to the core memory 203, column decoders 202 for selectively providing third and programming voltages to the core memory 203, and a core memory 203 comprised of a plurality of memory cells each uniquely coupled between the row and column decoders 201, 202. The preferred magnitude for the first, second, third, and programming voltages are 3.0, 1.0, 0.0, and 25.0 volts DC, respectively. The first, second, and third voltages are used to couple data, address, and control signals to and from peripheral devices (i.e. microprocessors, direct memory access controllers), the core memory 203, and programming voltage generator 208. The high voltage 204, 205, and low voltage 206, 207, sections in the row decoders 201 and column decoders 202 are separate in the preferred embodiment. Since the read mode requires only the low voltage sections 206, 207, the controller will shut down the programming voltage generator 208 during read mode operation yielding a system power savings.

Figure 3:
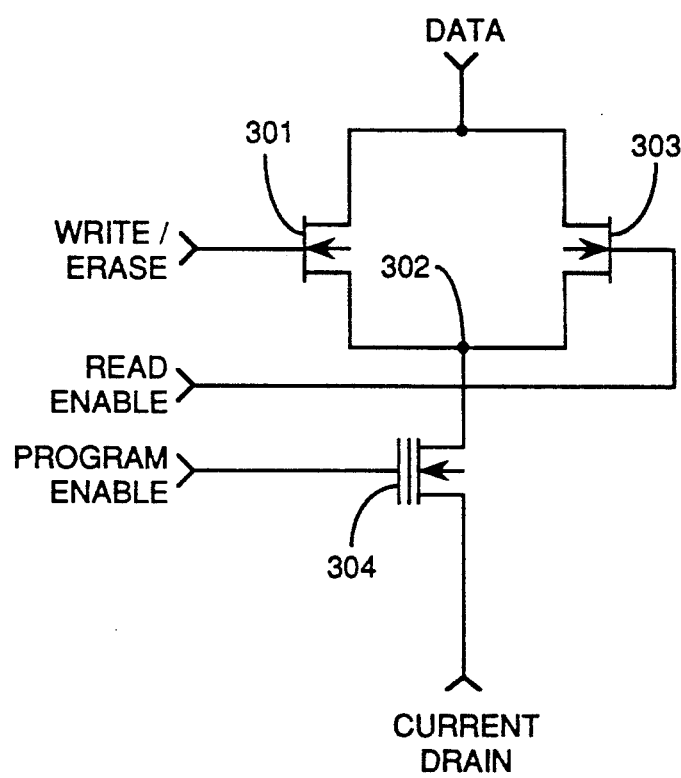
FIG. 3 is a schematic of a memory cell in accordance with the preferred embodiment.

Referring to FIG. 3, the preferred embodiment of the EEPROM memory cell comprises a data terminal capable of receiving and transmitting data, a read enable terminal capable of receiving one of the first, second, and third voltages, a write/erase terminal capable of receiving one of the programming voltage and the third voltage, the program enable terminal capable of receiving one of the programming voltage and the third voltage, a current drain terminal, a first field effect transistor 301 having its drain-source current path coupled between a data terminal and a node 302, and a gate coupled to a write/erase terminal, a second field effect transistor 303 having its drain-source current path coupled between a data terminal and a node 302, and a gate coupled to a read enable terminal, and a floating gate field effect transistor 304 having its drain-source current path coupled between a node 302 and a current drain terminal, and a gate coupled to a program enable terminal. Data from the data terminal is written into the memory cell when the programming voltage is applied to the write/erase terminal and the third voltage is applied to the read enable and program enable terminals. Data is read from the data terminal when the first voltage is applied to the read enable terminal and the third voltage is applied to the write/erase, program enable, and current drain terminals. Data is read from the data terminal when the second voltage is applied the read enable terminal and the third voltage is applied to the write/erase, program enable, and current drain terminals. Data is erased from the memory cell when the programming voltage is applied to the write/erase and program enable terminals and the third voltage is applied to the read enable, data, and current drain terminals.

I claim:

1. A memory system comprising:
   voltage means for generating write and read voltages and selectively generating a programming voltage;
   a plurality of memory cells; and
   decoder means coupled to the voltage means for receiving the write, read, and programming voltages, and uniquely coupled to each of the memory cells for reading the cells by applying the read voltage to the cells during a read mode, and for writing the cells by applying the write voltage and the programming voltage to the cells during a write mode, the decoder means enabling the voltage means so that the programming voltage is generated from the write voltage during the write mode and disabling the voltage means so that the programming voltage is not generated during the read mode.

2. A memory system comprising:
   voltage means for generating programming voltages;
   row decoder means coupled to said voltage means for selectively supplying first, second, third and programming voltages;
   column decoder means coupled to said voltage means for selectively providing said third and programming voltages; and
   a plurality of memory cells each uniquely coupled between said row decoder means and said column decoder means, each of said cells comprising:
   a data terminal for receiving and transmitting data;
   a read enable terminal for receiving one of said first, second, and third voltages;
   a write/erase terminal for receiving one of said programming voltage and said third voltage;
   a program enable terminal for receiving one of said programming voltage and said third voltage;
   a current drain terminal;
   a first field effect transistor having its drain-source current path coupled between said data terminal and a node, and a gate coupled to said write/erase terminal;
   a second field effect transistor having its drain-source current path coupled between said data terminal and said node, and a gate coupled to said read enable terminal; and
   a floating gate field effect transistor having its drain-source current path coupled between said node and said current drain terminal, and a gate coupled to said program enable terminal; data being written into said cell when said programming voltage is applied from said row decoder to said write/erase terminal and to said data terminal, and the second voltage is applied from said row decoder to said read enable terminals and said third voltage is applied from said column decoder to said program enable terminal; data being read from said cell when one of (a) said first voltage is applied by said row decoder to said read enable terminal and said third voltage is applied by said column decoder to said write/enable terminal, said program enable terminal, and said current drain terminal and (b) said second voltage is applied by said row decoder to said read enable terminal and said third voltage is applied by said column decoder to said current drain terminal, said write/erase terminal, and said program enable terminal; said voltage means not generating programming voltages when data is being read; and data being erased from said cell when said programming voltage is applied from said row decoder to said write/erase terminal and said program enable terminal and said third voltage is applied by said column decoder to said data terminal and said current drain terminal, and said second voltage is applied from said row decoder to said read enable terminal.

3. The memory system according to claim 2 wherein said first voltage, second voltage, and programming voltage have magnitudes greater than said third voltage.

4. The memory system according to claim 2 wherein said programming voltage has a magnitude substantially greater than said first voltage, second voltage, and third voltage, and said programming voltage is generated by multiplying said first voltage.

5. The memory system according to claim 2 wherein said first voltage has a magnitude greater than said second voltage.

6. The memory system according to claim 2 wherein said programming, first, second, and third voltages have decreasing magnitudes, respectively.

7. An electrically erasable programmable memory cell comprising:
   a data terminal for receiving and transmitting data;
   a read enable terminal for receiving one of a first, second, and third voltages;
   a write/erase terminal for receiving one of a programming voltage and a third voltage;
   a program enable terminal for receiving one of a programming voltage and a third voltage;

a current drain terminal;

a first field effect transistor having its drain-source current path coupled between said data terminal and a node, and a gate coupled to said write/erase terminal;

a second field effect transistor having its drain-source current path coupled between said data terminal and said node, and a gate coupled to said read enable terminal; and a floating gate field effect transistor having its drain-source current path coupled between said node and said current drain terminal, and a gate coupled to said program enable terminal, whereby data from said data terminal is written into said cell when the programming voltage is applied to said write/erase terminal and said third voltage is applied to said read enable and program enable terminals, data is read from said data terminal when said first voltage is applied to said read enable terminal and said third voltage is applied to said write/erase, program enable, and current drain terminals, data is read from said data terminal when said second voltage is applied to said read enable terminal and said third voltage is applied to said write/erase, program enable, and current drain terminals, and data is erased from said cell when said programming voltage is applied to said write/erase and program enable terminals and said third voltage is applied to said read enable, data, and current drain terminals.

8. The memory system according to claim 7 wherein said first voltage, second voltage, and programming voltage have magnitudes greater than said third voltage.

9. The memory system according to claim 7 wherein said programming voltage has a magnitude substantially greater than said first voltage, second voltage, and third voltage, and said programming voltage is generated by multiplying said first voltage.

10. The memory system according to claim 7 wherein said first voltage has a magnitude greater than said second voltage.

* * * * *